(12) United States Patent
Hwang et al.

(10) Patent No.: US 9,142,285 B2
(45) Date of Patent: Sep. 22, 2015

(54) MULTI-PORT SRAM WITH SHARED WRITE BIT-LINE ARCHITECTURE AND SELECTIVE READ PATH FOR LOW POWER OPERATION

(71) Applicant: National Chiao Tung University, Hsinchu (TW)

(72) Inventors: Wei Hwang, Hsinchu (TW); Dao-Ping Wang, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 19 days.

(21) Appl. No.: 14/105,729

(22) Filed: Dec. 13, 2013

(65) Prior Publication Data

US 2015/0170734 A1  Jun. 18, 2015

(51) Int. Cl.
  *G11C 5/06* (2006.01)
  *G11C 11/412* (2006.01)

(52) U.S. Cl.
  CPC .................................. *G11C 11/412* (2013.01)

(58) Field of Classification Search
  CPC ...... G11C 8/16; G11C 11/412; G11C 7/1075; G11C 7/1051; G11C 7/1078; G11C 7/18; G11C 11/419; G11C 7/1069; G11C 7/12

USPC .................. 365/120.05, 230.03, 189.04, 207, 365/189.08, 189.15, 210.12, 226, 63, 120
  See application file for complete search history.

(56) References Cited

U.S. PATENT DOCUMENTS

2008/0151653 A1* 6/2008 Ishikura et al. .......... 365/189.15

* cited by examiner

*Primary Examiner* — Thong Q Le
(74) *Attorney, Agent, or Firm* — Muncy, Geissler, Olds & Lowe, P.C.

(57) ABSTRACT

A multi-port SRAM with shared write bit-line architecture and selective read path for low power operation includes a first memory cell, a second memory cell, and a common switch set. The second memory cell makes use of the common switch set to share the A-port write bit-line and the B-port write bit-line with the first memory cell so as to reduce half write bit-line number and reduce the write current consumption caused by pre-charging the bit-line to VDD. It also provides a selective read path structure for read operation. Replacing the ground connection in the read port with a virtual VSS controlled by a Y-select signal reduces read-port current consumption.

9 Claims, 20 Drawing Sheets

| Write 1 selected | Write 0 selected | Read | Non-selected |
|---|---|---|---|
| VVSS level  0V⎤_⎣−0.1V ~ −0.25V | 0V | 0V | 0V |

FIG. 7

MULTI-PORT SRAM WITH SHARED WRITE BIT-LINE ARCHITECTURE AND SELECTIVE READ PATH FOR LOW POWER OPERATION

BACKGROUND OF THE INVENTION

1. Field of the Invention

The present invention relates to the technical field of dual-port static random access memory (SRAM) and, more particularly, to a multi-port (MP) SRAM with shared write bit-line architecture and selective read path for low power operation.

2. Description of Related Art

In recent years, the IC design demands more transmission bandwidths, such that the memory requirement is evolved from a single-port SRAM into a dual-port SRAM. Because the single-port SRAM does not have advanced feature of parallel operation for high speed communication and video applications, the dual-port SRAM that can perform a parallel read or write operation on different ports is proposed, but it introduces read/write disturb issues in the same row access.

Conventional multi-port SRAM design suffers write-disturb issues, when executing write operations with different ports at the same row. FIG. 1 schematically illustrates access of two adjacent bit cells of a conventional multi-port SRAM. When an A-port for writing and column 1 are selected, the bit cell with the same row in column 0 becomes write-half-select. Meanwhile, writing "0" in column 0 from B-port is difficult because the storage node is pre-charged to high through the activated write A-port word-line (WAWL). In this case, the bit cell in column 0 encounters a write-disturb issue. Conversely, when B-port for writing is activated and column 0 is selected, the bit cell in column 1 at the same row becomes write-half-select. Meanwhile, writing "0" in column 1 from A-port is difficult because the storage node is pre-charged to high through the activated write B-port word-line (WBWL). In this condition, the bit cell in column 1 encounters the write-disturb issue. As shown in FIG. 1, the two adjacent bit-cells encounter write-disturb issue.

In addition to the write-disturb issue, the write-half-select cell encounters a read static noise margin (RSNM) that is worse than the hold static noise margin (HSNM) issue. As shown in FIG. 1, when the bit cell in column 0 encounters a write-half-select issue, its storage node suffers disturbance noise from the bit-line pair, i.e. WABL0 and WABLB0, being pre-charged to high, despite the B port for writing being deactivated in column 0. The RSNM degrades most when both write ports activate at the same row.

When a write-half-select (dummy read) occurs in the cell of an unselected column, the RSNM becomes worse than the HSNM with the write bit-line of both write-ports deactivated, as the butterfly curve shown in FIG. 2, which schematically shows hold SNM and dummy-read SNM of conventional multi-port cell. As shown in FIG. 2, when the write bit-line of the A-port for writing is activated, the WABL and WABLB are pre-charged to high, disturbing the internal storage node. This in turn causes the RSNM to deteriorate, as shown by the triangle-dot butterfly curve shown in FIG. 2. When both ports are activated, deterioration of the RSNM is the worst, as shown by the circle-dot butterfly curve in FIG. 2.

Accordingly, it is desirable to provide a multi-port SRAM with shared write bit-line architecture and selective read path for low power operation to mitigate and/or obviate the aforementioned problems.

SUMMARY OF THE INVENTION

The object of the present invention is to provide a multi-port SRAM with shared write bit-line architecture and selective read path for low power operation, which can share adjacent bit-lines, cancel write disturb, and expand the static noise margin. Furthermore, the total number of write bit-lines can be reduced to half thereby reducing the write power consumption on charging a bit-line. As compared with the conventional multi-port SRAM, the present invention can also reduce the bit-line leakage.

According to a feature of the present invention, there is provided a multi-port SRAM with shared write bit-line architecture and selective read path for low power operation, which comprises a first memory cell, a second memory cell, and a common switch set. The first memory cell has a first storage unit, a first switch set, and a second switch set. The first switch set is connected to a first read A-port bit-line (RABL0), a first B-port read bit-line (RBBL0), and the first storage unit. The second switch set is coupled to an A-port write bit-line (WABL0) and a B-port write bit-line (WBBL0), and is connected to the first storage unit. The second memory cell has a second storage unit, a third switch set, and a fourth switch set. The third switch set is connected to a second A-port read bit-line (RABL1), a second B-port read bit-line (RBBL1), and the second storage unit. The fourth switch set is coupled to the A-port write bit-line (WABL0) and the B-port write bit-line (WBBL0), and is connected to the second storage unit. The common switch set is connected to the second switch set and the fourth switch set, wherein the second memory cell makes use of the common switch set to share the A-port write bit-line (WABL0) and the B-port write bit-line (WBBL0) with the first memory cell.

Other objects, advantages, and novel features of the invention will become more apparent from the following detailed description when taken in conjunction with the accompanying drawings.

BRIEF DESCRIPTION OF THE DRAWINGS

FIG. 7 is a schematic diagram of the first low voltage (VVSS) operation according to the present invention;

DETAILED DESCRIPTION OF THE PREFERRED EMBODIMENT

Figure 3:
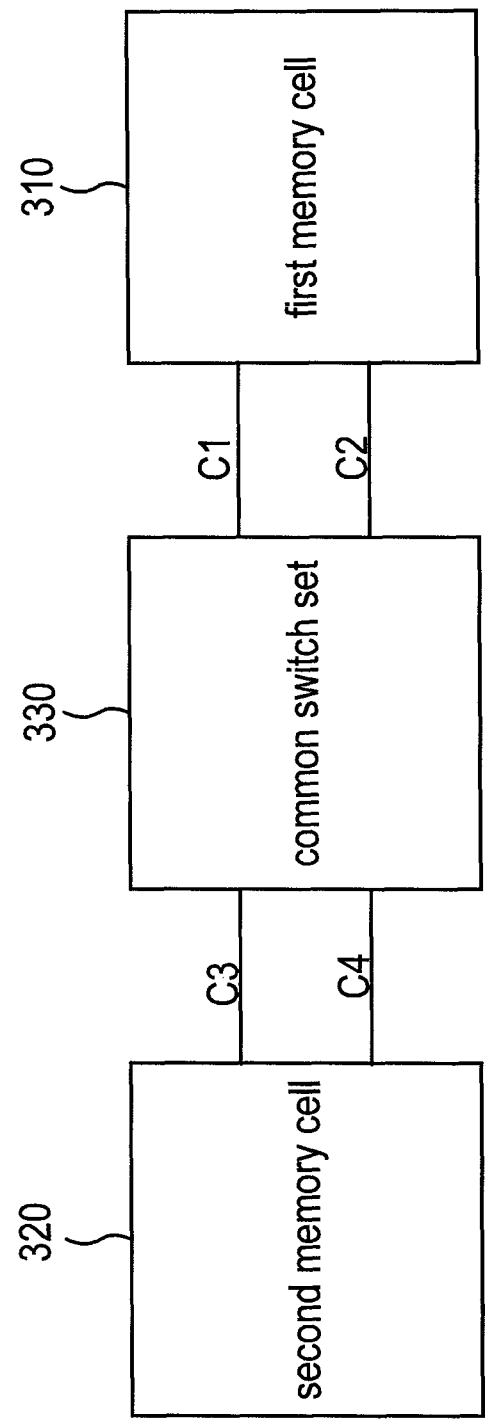
FIG. 3 is a schematic diagram of a multi-port SRAM with shared write bit-line architecture and selective read path for low power operation according to the invention.

FIG. 3 is a schematic diagram of a multi-port SRAM with shared write bit-line architecture and selective read path for low power operation according to the invention. As shown, the multi-port SRAM 300 includes a first memory cell 310, a second memory cell 320, and a common switch set 330.

Figure 4A:
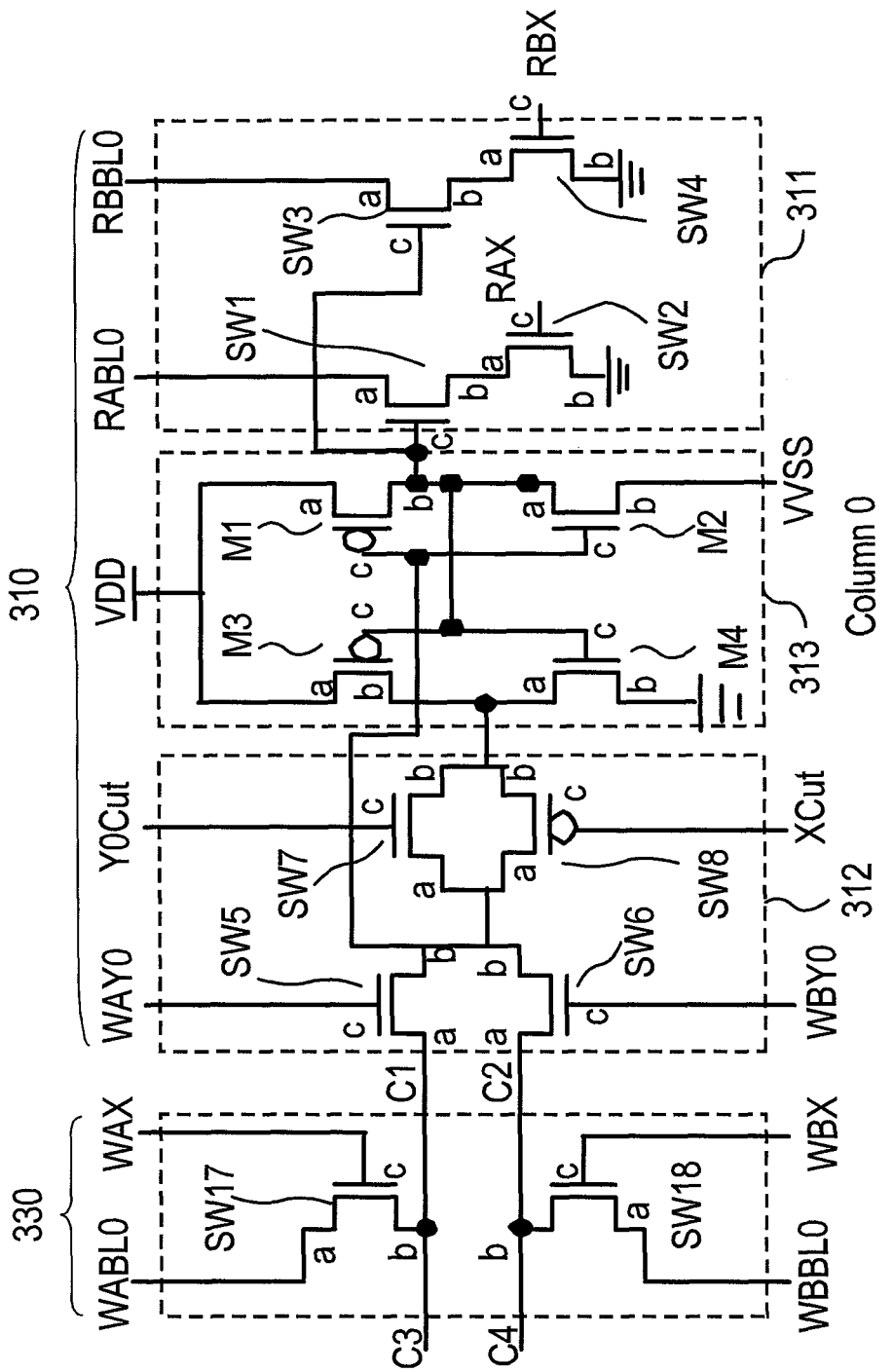
FIG. 4A and FIG. 4B are circuit diagrams of a multi-port SRAM with shared write bit-line architecture for low power operation according to the invention.
Figure 4B:
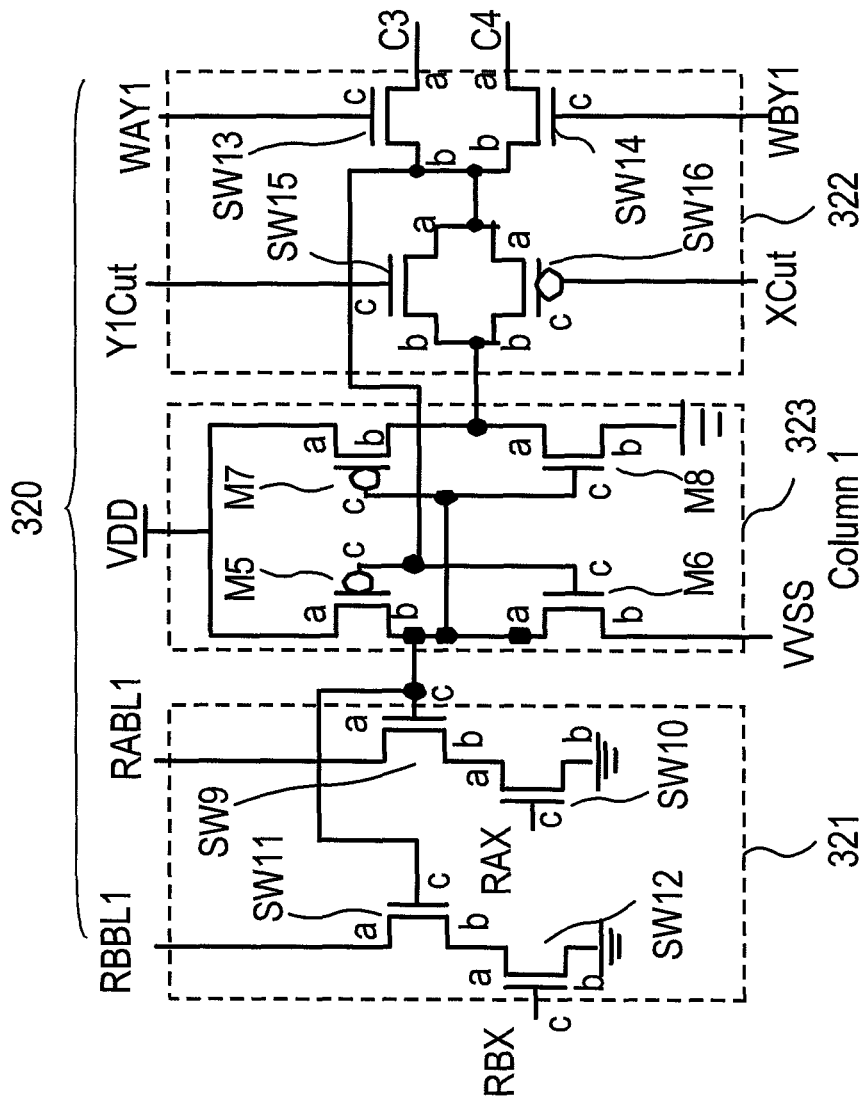

FIG. 4A and FIG. 4B are circuit diagrams of a multi-port SRAM 300 with shared write bit-line architecture and selective read path for low power operation according to the invention. As shown, the first memory cell 310 has a first storage unit 313, a first switch set 311, and a second switch set 312. The first switch set 311 is connected to a first A-port read bit-line (RABL0), a first B-port read bit-line (RBBL0), and the first storage unit 313. The second switch set 312 is coupled to an A-port write bit-line (WABL0) and a B-port write bit-line (WBBL0), and connected to the first storage unit 313.

The second memory cell 320 has a second storage unit 323, a third switch set 321, and a fourth switch set 322. The third switch set 321 is connected to a second A-port read bit-line (RABL1), a second B-port read bit-line (RBBL1), and the second storage unit 323. The fourth switch set 322 is coupled to the A-port write bit-line (WABL0) and the B-port write bit-line (WBBL0), and connected to the second storage unit 323.

The common switch set 330 is connected to the second switch set 312 and the fourth switch set 322, wherein the second memory cell 320 makes use of the common switch set 330 to share the A-port write bit-line (WABL0) and the B-port write bit-line (WBBL0) with the first memory cell 310.

As shown in FIG. 4A and FIG. 4B, the first switch set 311 and the third switch set 321 have same structure, and the second switch set 312 and the fourth set 322 have same structure. The first storage unit 313 has a first transistor (M1), a second transistor (M2), a third transistor (M3) and a fourth transistor (M4), and the second storage unit 323 has a fifth transistor (M5), a sixth transistor (M6), a seventh transistor (M7), and an eighth transistor (M8).

The first transistor (M1) has a first end (a) connected to a high voltage (VDD), a control end (c) connected to a control end (c) of the second transistor (M2), and a second end (b) connected to a first end (a) of the second transistor (M2). The second transistor (M2) has a second end (b) connected to a first low voltage (VVSS). The third transistor (M3) has a first end (a) connected to the high voltage (VDD), a control end (c) connected to a control end (c) of the fourth transistor (M4) and the second end (b) of the first transistor (M1), and a second end (b) connected to a first end (a) of the fourth transistor (M4). The fourth transistor (M4) has a second end (b) connected to a second low voltage (GND).

The fifth transistor (M5) has a first end (a) connected to the high voltage (VDD), a control end (c) connected to a control end (c) of the sixth transistor (M6), and a second end (b) connected to a first end (a) of the sixth transistor (M6). The sixth transistor (M6) has a second end (b) connected to the first low voltage (VVSS). The seventh transistor (M7) has a first end (a) connected to the high voltage (VDD), a control end (c) connected to a control end (c) of the eighth transistor (M8) and the second end (b) of the fifth transistor (M5), and a second end (b) connected to a first end (a) of the eighth transistor (M8). The eighth transistor (M8) has a second end (b) connected to the second low voltage (GND).

The first switch set 311 has a first switch (SW1), a second switch (SW2), a third switch (SW3), and a fourth switch (SW4). The second switch set 312 has a fifth switch (SW5), a sixth switch (SW6), a seventh switch (SW7), and an eighth switch (SW8). The third switch set 321 has a ninth switch (SW9), a tenth switch (SW10), an eleventh switch (SW11) and a twelfth switch (SW12). The fourth switch set 322 has a thirteenth switch (SW13), a fourteenth switch (SW14), a fifteenth switch (SW15) and a sixteenth switch (SW16).

The common switch set 330 has a seventeenth switch (SW17) and an eighteenth switch (SW18). The seventeenth switch (SW17) has one end (a) connected to the A-port write bit-line (WABL0), a control terminal (c) connected to a row write A-port control line (WAX), and the other end (b) connected to the fifth switch (SW5). The eighteenth switch (SW18) has one end (a) connected to the B-port write bit-line (WBBL0), a control terminal (c) connected to a row write B-port control line (WBX), and the other end (b) connected to the sixth switch (SW6).

The first switch (SW1) has one end (a) connected to the first A-port read bit-line (RABL0), a control terminal (c) connected to the second end (b) of the first transistor (M1), and the other end (b) connected to one end (a) of the second switch (SW2). The second switch (SW2) has the other end (b) connected to the second low voltage (GND) and a control terminal (c) connected to a row read A-port control line (RAX). The third switch (SW3) has one end (a) connected to the first B-port read bit-line (RBBL0), a control terminal (c) connected to the control terminal (c) of the first switch (SW1), and the other end (b) connected to one end (a) of the fourth switch (SW4). The fourth switch (SW4) has the other end (b) connected to the second low voltage (GND) and a control terminal (c) connected to a row read B-port control line (RBX).

The fifth switch (SW5) has one end (a) connected to the common switch set 330, a control terminal (c) connected to a first-column write A-port control line (WAY0), and the other end (b) connected to the control end (c) of the first transistor (M1). The sixth switch (SW6) has one end (a) connected to the common switch set 330, a control terminal (c) connected to a first-column write B-port control line (WBY0), and the other end (b) connected to the control end (c) of the first transistor (M1). The seventh switch (SW7) has one end (a) connected to the control end (c) of the first transistor (M1), a control terminal (c) connected to a first-column cut control line (Y0Cut), and the other end (b) connected to the second end (b) of the third transistor (M3). The eighth switch (SW8) has one end (a) connected to the control end (c) of the first transistor (M1), a control terminal (c) connected to a row cut control line (XCut), and the other end (b) connected to the second end (b) of the third transistor (M3).

The ninth switch (SW9) has one end (a) connected to the second A-port read bit-line (RABL1), a control terminal (c) connected to the second end (b) of the fifth transistor (M5), and the other end (b) connected to one end (a) of the tenth switch (SW10). The tenth switch (SW10) has the other end (b) connected to the second low voltage (GND) and a control terminal (c) connected to the row read A-port control line (RAX). The eleventh switch (SW11) has one end (a) connected to the second B-port read bit-line (RBBL1), a control terminal (c) connected to the control terminal (c) of the ninth switch (SW9), and the other end (b) connected to one end (a) of the twelfth switch (SW12). The twelfth switch (SW12) has the other end (b) connected to the second low voltage (GND) and a control terminal (c) connected to the row read B-port control line (RBX).

The thirteenth switch (SW13) has one end (a) connected to the common switch set 330, a control terminal (c) connected to a second-column write A-port control line (WAY1), and the other end (b) connected to the control end (c) of the fifth transistor (M5). The fourteenth switch (SW14) has one end (a) connected to the common switch set 330, a control terminal (c) connected to a second-column write B-port control line (WBY1), and the other end (b) connected to the control end (c) of the fifth transistor (M5). The fifteenth switch (SW15) has one end (a) connected to the control end (c) of the fifth transistor (M5), a control terminal (c) connected to a second-column cut control line (Y1Cut), and the other end (b) connected to the second end (b) of the seventh transistor (M7). The sixteenth switch (SW16) has one end (a) connected to the control end (c) of the fifth transistor (M5), a control terminal (c) connected to the row cut control line (XCut), and the other end (b) connected to the second end (b) of the seventh transistor (M7).

The first to seventh switches (SW1-SW7), the ninth to fifteenth switches (SW9-SW15), the seventeenth switch (SW17), and the eighteenth switch (SW18) are each an NMOS transistor, and the eighth and sixteenth switches (SW8, SW16) are each a PMOS transistor. The first to fourth transistors (M1-M4) form a latch, and the fifth to eighth transistors (M5-M6) form a latch. First low voltage (VVSS) is lower than the second low voltage (GND).

Figure 4C:
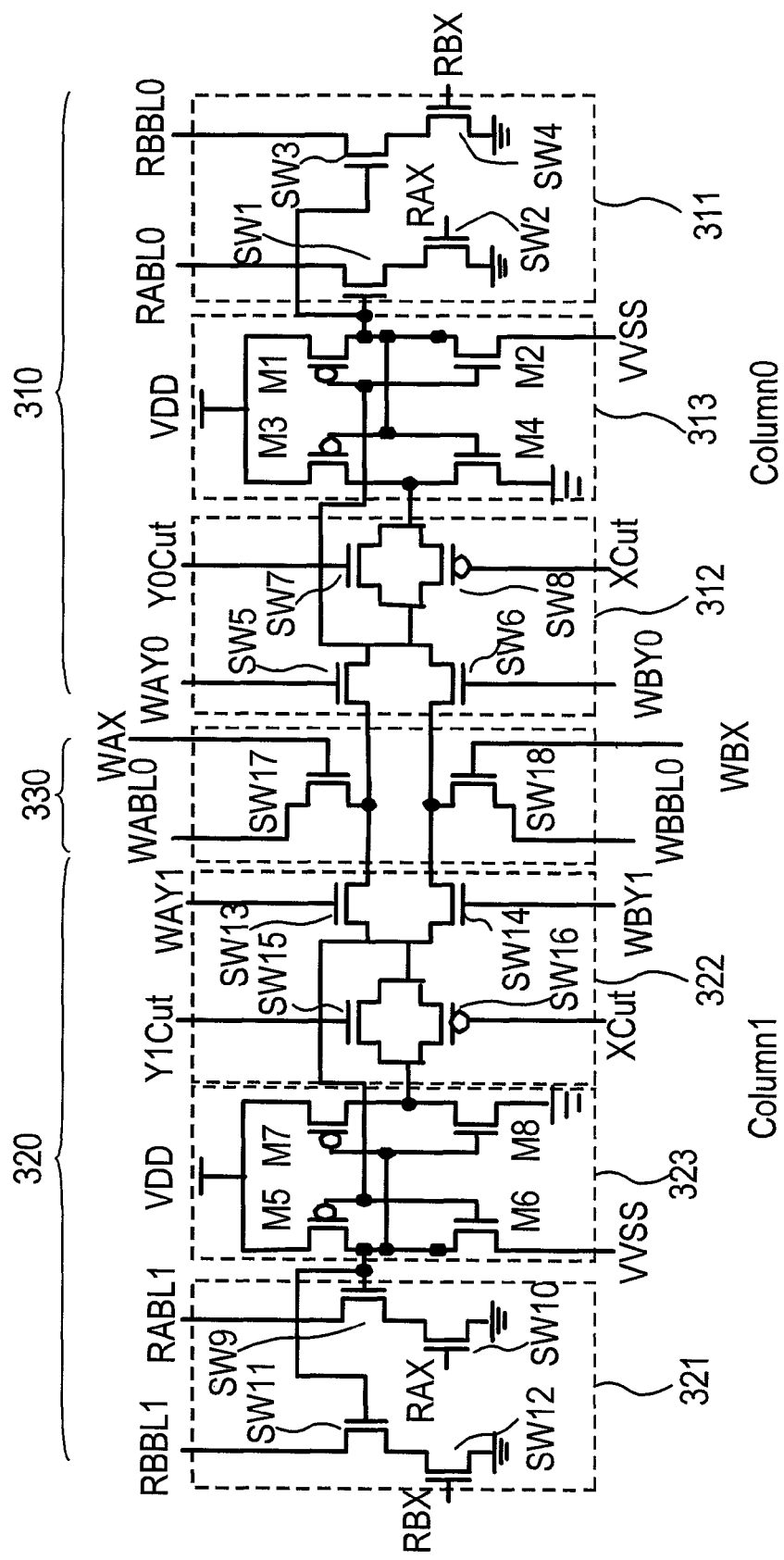
FIG. 4C is an overall circuit diagram of combining first memory cell, second memory cell, and common switch set according to the invention.

FIG. 4C is an overall circuit diagram of combining first memory cell 310, second memory cell 320, and common switch set 330 according to the invention. As shown in FIG. 4C, it is known that the second memory cell 320 makes use of the common switch set 330 to share the A-port write bit-line (WABL0) and the B-port write bit-line (WBBL0) with the first memory cell 310.

Figure 5:
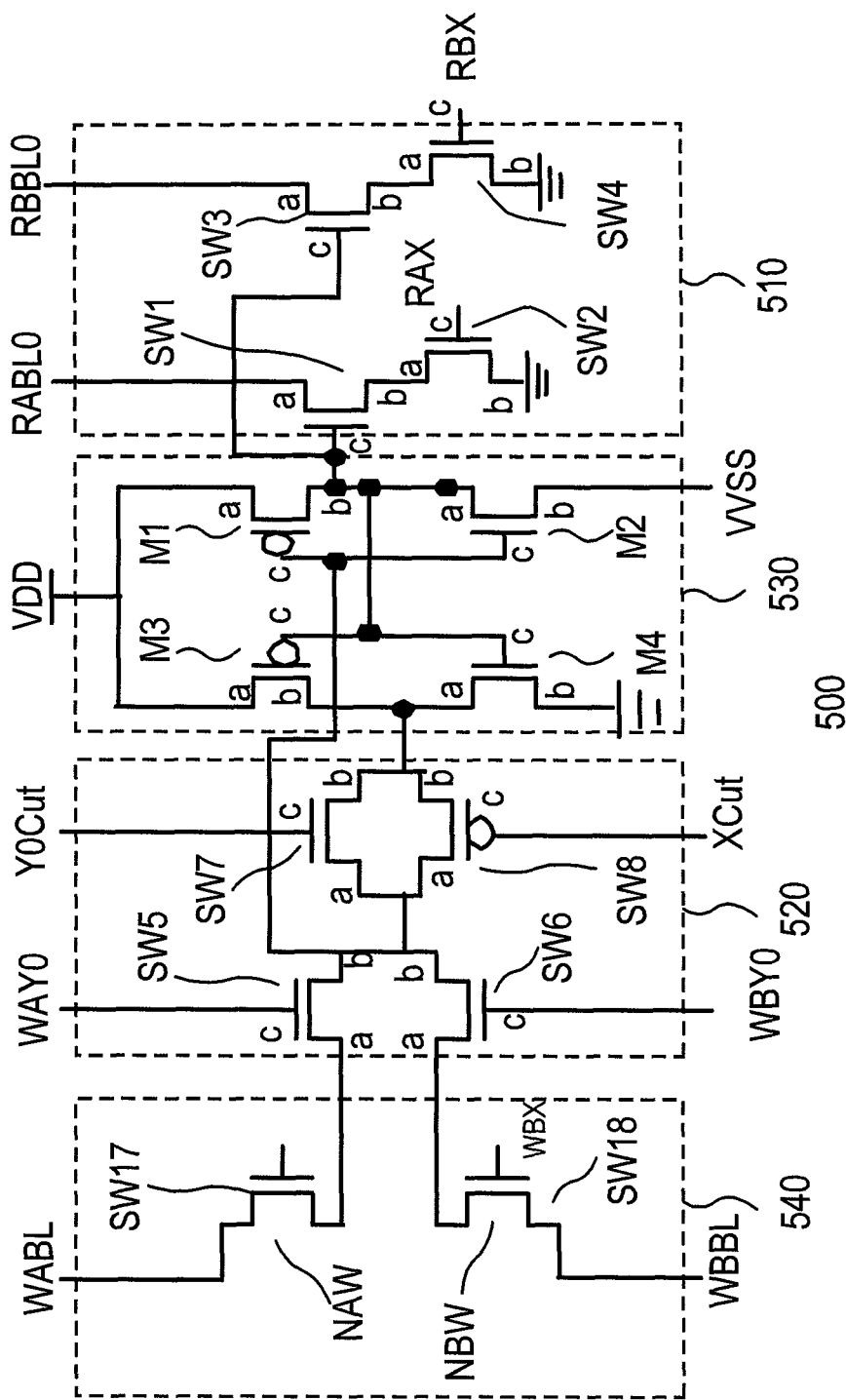
FIG. 5 is a circuit diagram of a multi-port (MP) 14-transistor SRAM cell according to the invention.

FIG. 5 is a circuit diagram of a multi-port (MP) 14-transistor SRAM cell according to the invention. In the present invention, the first memory cell 410, the second memory cell 420, and the common switch set 430 are originated from the circuit of FIG. 5, which is a schematic diagram of a dual-port SRAM cell 500 according to the invention. The multi-port SRAM cell 500 includes a storage unit 530, a first switch set 510, a second switch set 520, and a common switch set 540.

As shown in FIG. 4C and FIG. 5, it shares the write access switches, SW17 and SW18, with the left adjacent memory cell. That is, the second memory cell 320 makes use of the common switch set 330 to share the A-port write bit-line (WABL0) and the B-port write bit-line (WBBL0) with the first memory cell 310. Unlike a conventional 2W2R multi-port (MP) cell with double-end write bit-lines shown in FIG. 1, the multi-port memory cell of the present invention has only a single-end write bit-line. Therefore, it is necessary to insert a pair of cut-switches SW7 and SW8 into the cross-coupled latch within a bit cell, as shown in FIG. 5. The two cut-switches SW7 and SW8 can enhance write capability to the bit cell with a single-end write bit-line.

In a conventional MP memory cell scheme, the X-direction access switches connect the internal node Q to a write A-port bit-line and a write B-port bit-line of A-port and B-port, respectively. The MP cell of the present invention adds Y-direction access switches (column direction control) SW5 and SW6 between the X-direction write-access switches and internal node.

FIG. 4C shows a schematic diagram in which two adjacent MP 12-transistor bit cells are connected. The adjacent first memory cell 310 and second memory cell 320 in Column 0 and Column 1 are connected by Y-direction access switches which are controlled by the first-column write A-port control line (WAY0), the first-column write B-port control line (WBY0), the second-column write A-port control line (WAY1), and the second-column write A-port control line (WBY1). These columns share two common X-direction write-access switches which are controlled by the row write A-port control line WAX and the row write B-port control line WBX. The two A-port write bit-line (WABL0) and B-port write bit-line (WBBL0) can be shared between first memory cell 310 and second memory cell 320. Similarly, adjacent memory cells in Column 2 and Column 3 share two write-port bit-lines WABL2 and WBBL2 (not shown). Therefore, in the present invention, it retains only even-numbered write-port bit-line pairs, and omits odd-numbered write-port bit-line pairs. This halves the total write-port bit-line number, compared to that of the conventional MP cell array. Hence, it reduces the pre-charging bit-line to the VDD current of write port bit-lines, so as to mitigate the write current consumption.

Figure 6:
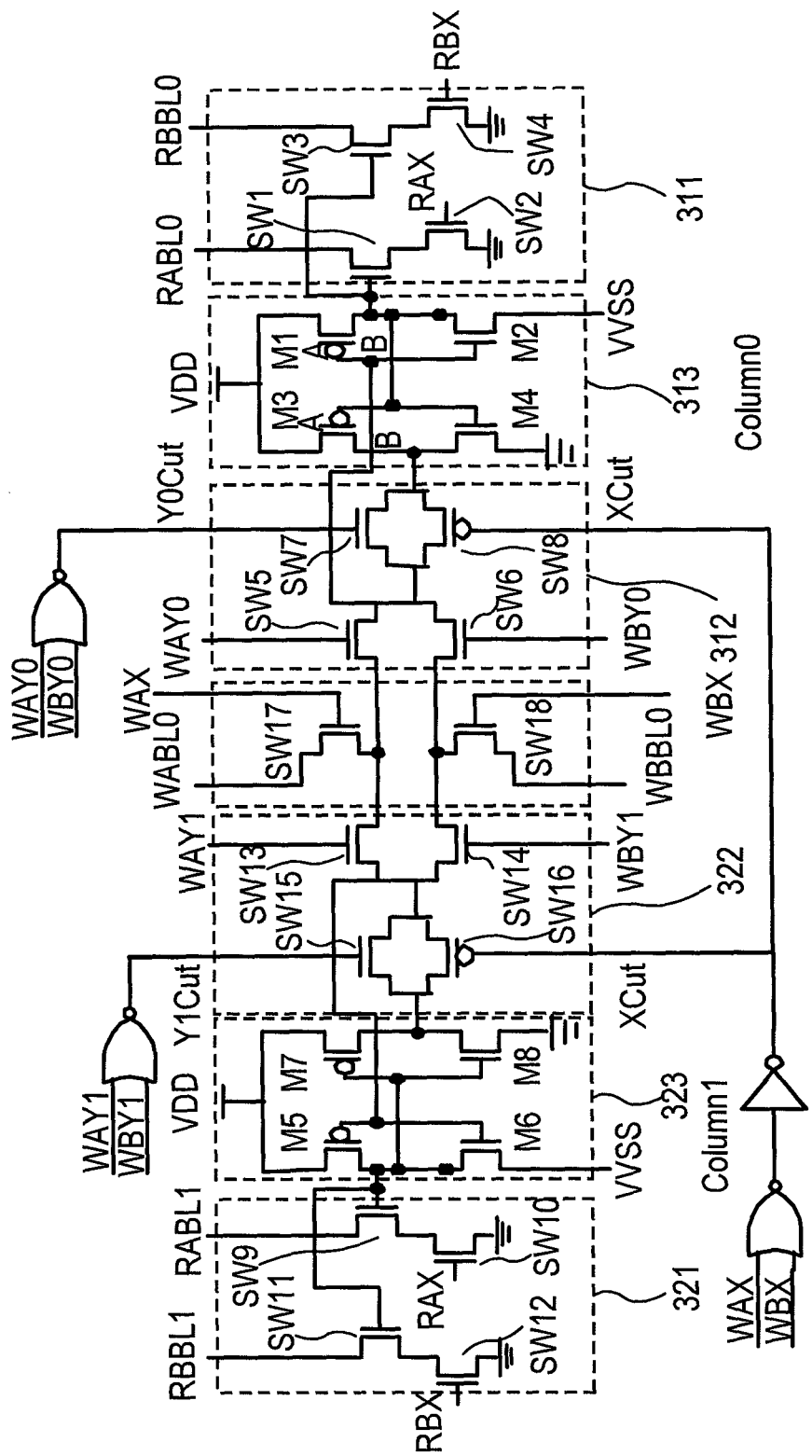
FIG. 6 is a circuit diagram of write enhancement logic to control the cut-off pass-gate according to the invention.

Because MP memory cell of the present invention is a single-end write bit-line scheme, it is possible to insert a pair of pass-gate switches (SW7 and SW8, SW15 and SW16) controlled by XCut and YCut to the cross-coupled inverters as shown in FIG. 6, which is a circuit diagram of a write enhancement logic to control the cut-off pass-gate according to the invention. When the bit cell is selected to write data, the row cut control line (XCut), the first-column cut control line (YCut0), and the second-column cut control line (Y1Cut) are turned off to cut the feedback loop of the cross-coupled inverters. This helps enhance the write capability. Xcut is an OR function output that is controlled by the row write A-port control line (WAX) and the row write B-port control line (WBX). When the row write A-port control line (WAX) or the row write B-port control line (WBX) is selected, the row cut control line (XCut) is deactivated to turn off the switches (SW8, SW16). The first-column cut control line (YCut0) is a NOR function output that is controlled by the first-column write A-port control line (WAY0) and the first-column write B-port control line (WBY0). When the first-column write A-port control line (WAY0) or the first-column write B-port control line (WBY0) is selected, the first-column cut control line (YCut0) is deactivated to turn off the pass-gate switches (SW7 and SW8). The second-column cut control line (YCut1) is a NOR function output that is controlled by the second-column write A-port control line (WAY1) and the second-column write B-port control line (WBY1). When the second-column write A-port control line (WAY1) or the second-column write B-port control line (WBY1) is selected, the second-column cut control line (YCut1) is deactivated to turn off the pass-gate switches (SW15 and SW16).

The first low voltage (VVSS) (or so called the virtual ground node) is a further enhancement for write "1" capability. When the bit cell is selected to write data "1," the first low voltage (VVSS) can be pulled down to a negative voltage level during a short write word-line-activated period. Because the "1" written from the write bit-line must pass through two series-connected switches, it suffers the NMOS transistor threshold voltage (Vt) drop and may not flip by pull-down of the NMOS transistor M2 or the NMOS transistor M8. However, if the first low voltage (VVSS) can pull down to a negative level, the voltage between the gate and the source (Vgs) of the NMOS transistor M2 or the NMOS transistor M8 enlarges and successfully flips the storage node to "0." If a column is to write "0", non-selected, or in read mode, the VVSS retains 0 V. FIG. 7 is a schematic diagram of the first low voltage (VVSS) operation according to the present invention. As shown in FIG. 7, when a column is to write "1", the first low voltage (VVSS) can pull down to a negative level.

Figure 8:
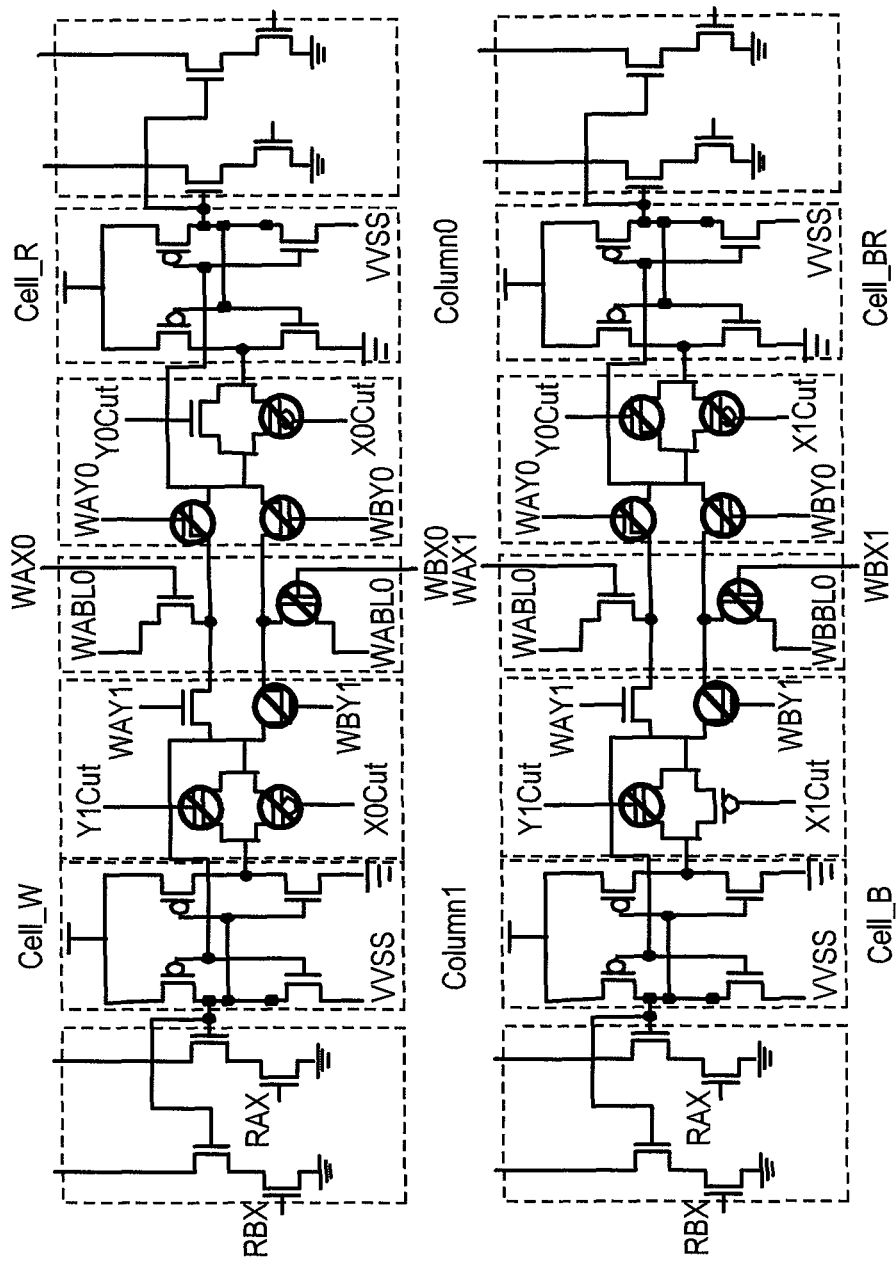
FIG. 8 is schematic diagram of operation of the multi-port SRAM cell according to the invention.
Figure 9:
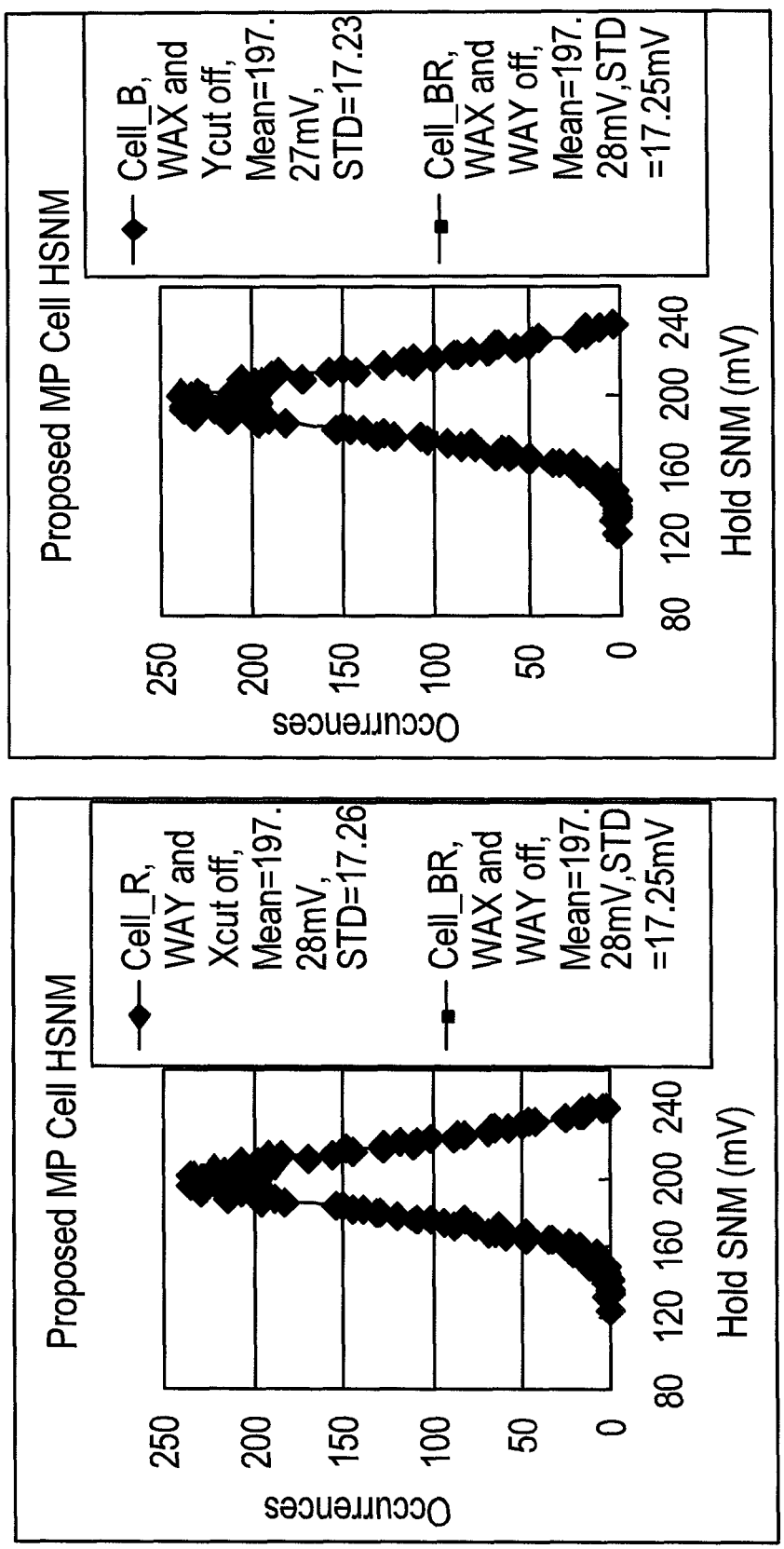
FIG. 9 shows a schematic diagram of the corresponding SNM distribution curves according to the invention.

FIG. 8 is schematic diagram of operation of the multi-port SRAM cell according to the invention. FIG. 9 shows a schematic diagram of the corresponding SNM distribution curves according to the invention. As shown in FIG. 8, the bit-cell Cell_W is the selected cell with the activated WAX0 and WAY1 to write data from the A-port write bit-line (WABL0). Hence, X0Cut and Y1Cut are deactivated through the row-control and column-control logic, and WBX0 and WBY1 are non-selected. The right adjacent cell Cell_R is the write-half-select bit cell with WAY0, WBY0, and X0Cut deactivated. Therefore, Cell_R can be isolated from the write bit-lines, WABL0, and WBBL0, and kept in a nearly hold state. The cell below Cell_W named Cell_B is another write-half-select bit cell in the column direction with WAX1, WBX1, WBY1, and Y1Cut deactivated. Therefore, Cell_B can also be isolated from the write bit-lines, WABL0, and WBBL0, and kept in a nearly hold state as well. The bottom-right cell Cell BR is not selected in either the row or column direction with WAX1, WBX1, WAY0, and WBY0 deactivated. Therefore, Cell_BR can be isolated from WABL0 and WBBL0 and kept in a complete hold state. FIG. 9 shows SNM curves of Cell_R, Cell_B, and Cell_BR shown in FIG. 8. The SNM curve of Cell_R nearly coincides with the Cell_BR HSNM curve, which is in a hold state. The bit-line disturbance noise of Cell_R is isolated because both column-direction-control signals WAY0 and WBY0 are deactivated. Similarly, the SNM curve of Cell_B nearly coincides with the Cell_BR HSNM curve. Thus, the bit-line disturbance noise of Cell_B is isolated because both row-direction-control signals WAX1 and WBX1 are deactivated. Therefore, the SNM degradation issue occurring in a conventional write-half-select cell can be overcome. The write-half-select static noise margin (SNM) and hold static noise margin (HSNM) curves shown in FIG. 9 are 10000 Monte Carlo simulation results in 0.6V VDD, 25° C., and fast speed (FS) corner.

Figure 10:
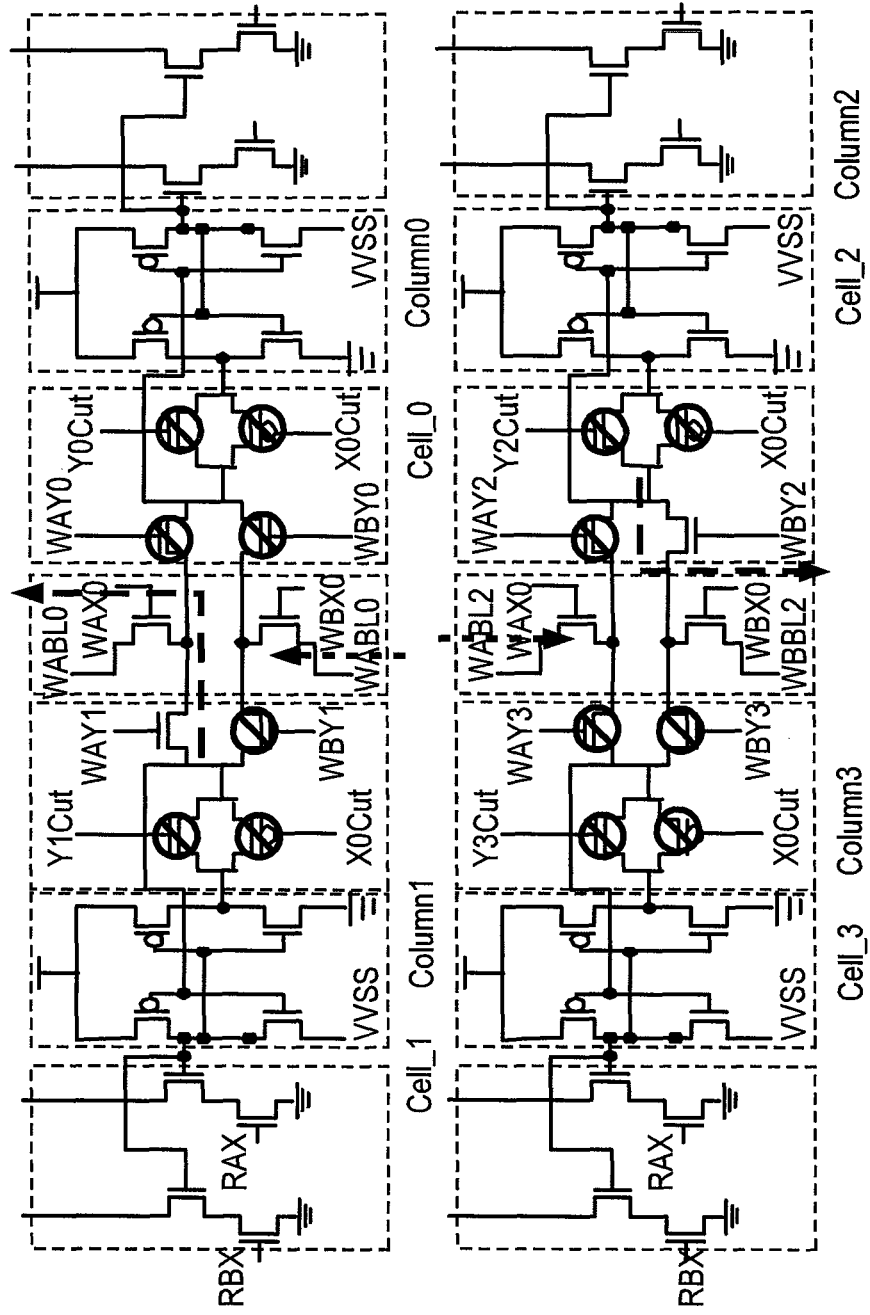
FIG. 10 shows a one-row diagram of connecting four MP cells in one row according to the present invention.

FIG. 10 shows a one-row diagram of connecting four MP cells in one row according to the present invention. When Cell_1 writes "0" from A-port write bit-line WABL0 in Column 1, the B-port write bit-line WBLB0 is pre-charged to high. In this case, WAY0 and WBY0 are deactivated because Cell_0 is not selected for write operation, and the path to the storage node of Cell_0 is cut off. Therefore, Cell_0 maintains its hold state and avoids the write-disturb issue. If Cell 2 additionally writes "0" from B-port write bit-line WBBL2 in Column 2 and Cell_3 is not selected for write operation, WAY3 and WBY3 are deactivated, and the path to the storage node of Cell_3 is cut off. Therefore, Cell_3 can maintain its hold state and avoid the write-disturb issue. Thus, the MP memory cell structure of the invention can overcome the write-disturb problem.

Figure 1:
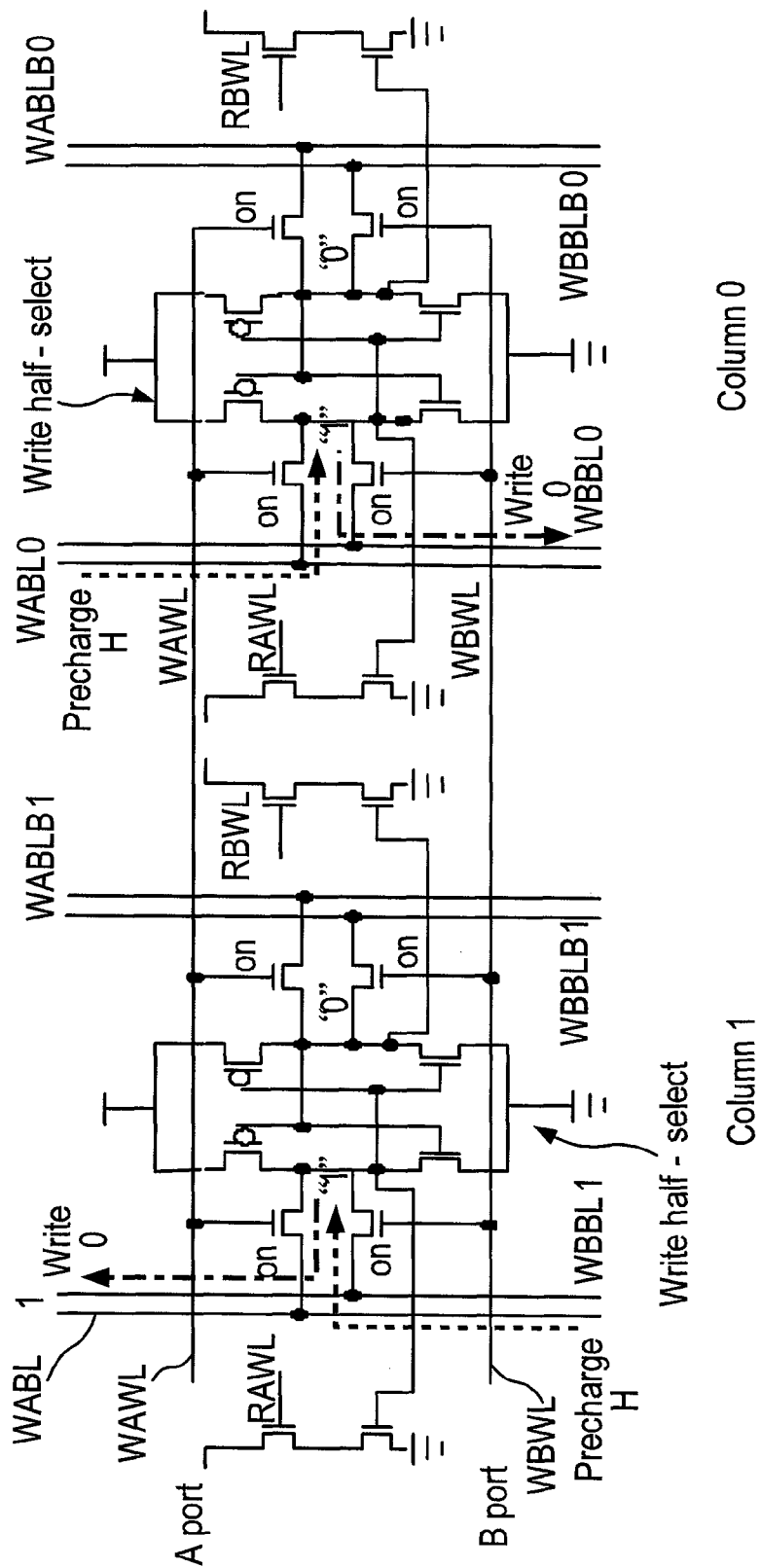
FIG. 1 schematically illustrates access of two adjacent bit cells of a conventional multi-port SRAM.
Figure 2:
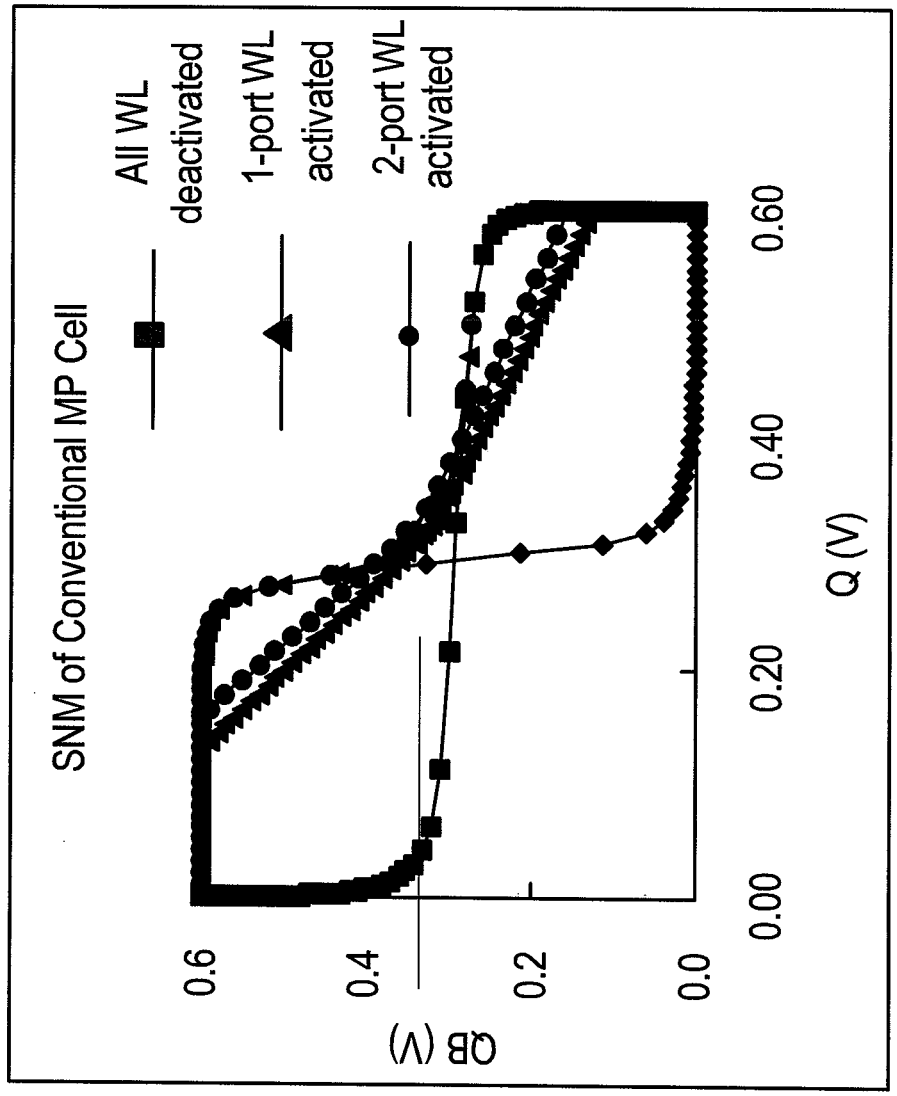
FIG. 2 schematically shows hold SNM and dummy-read SNM of conventional multi-port cell.

FIG. 4C shows a schematic diagram connecting two adjacent MP memory cells of Columns 0 and 1 according to the invention. This schematic diagram demonstrates bit-line number reduction, which can also mitigate bit-line and word-line capacitance. Columns 0 and 1 share the A-port write bit-line (WABL0) and B-port write bit-line (WBBL0). This approach halves the number of bit-lines. Columns 0 and 1 also share the write-access pass-gates (SW17, SW18), further reducing the gate capacitance of the write word-line control signal and the write bit-line junction capacitance. In conventional MP 12T cells, as shown in FIG. 1, WAWL/WBWL connects to both WABL0/WBBL0 and WABLB0/WBBLB0 separately. Therefore, the technology of the invention further reduces the word-line (WL) gate capacitance of the memory cell.

Figure 11:
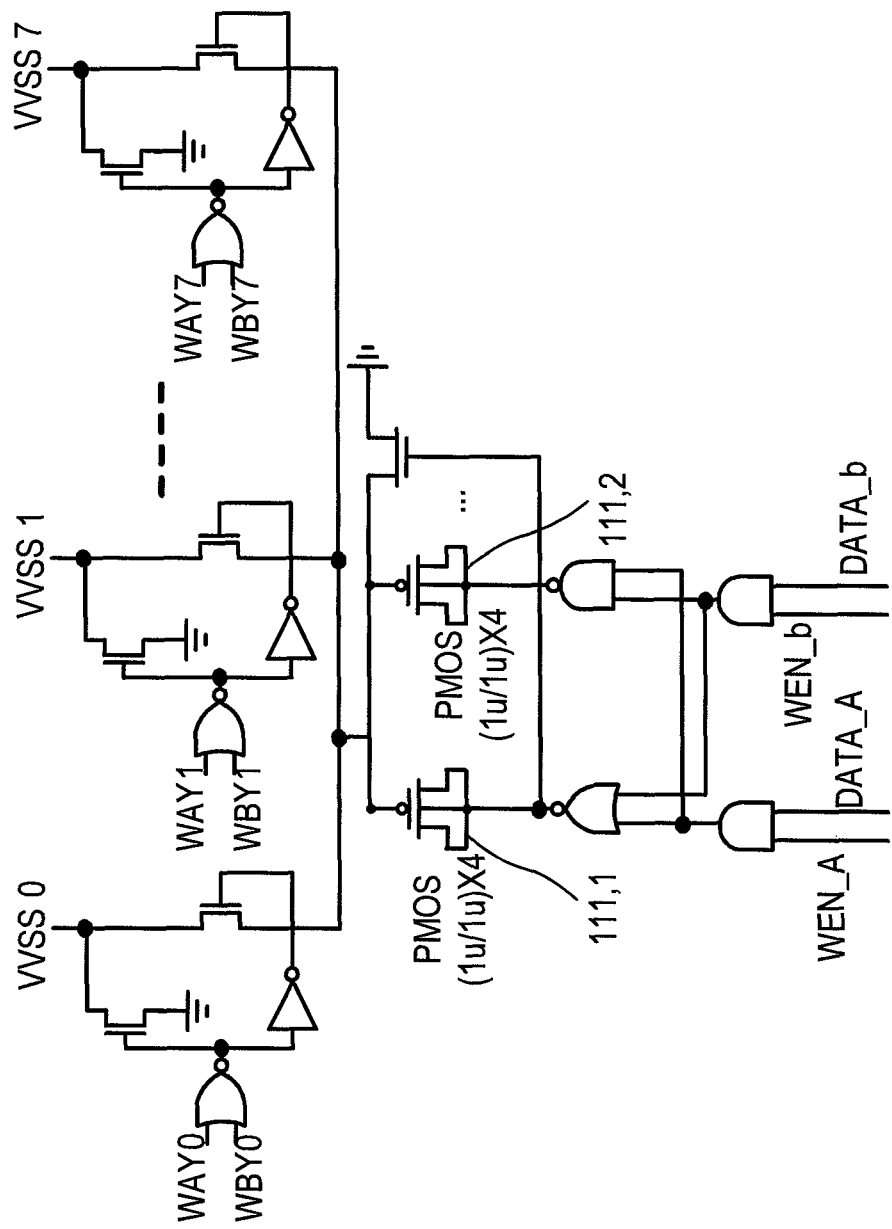
FIG. 11 shows a schematic diagram of data-aware negative VVSS generator according to the invention.
Figure 12:
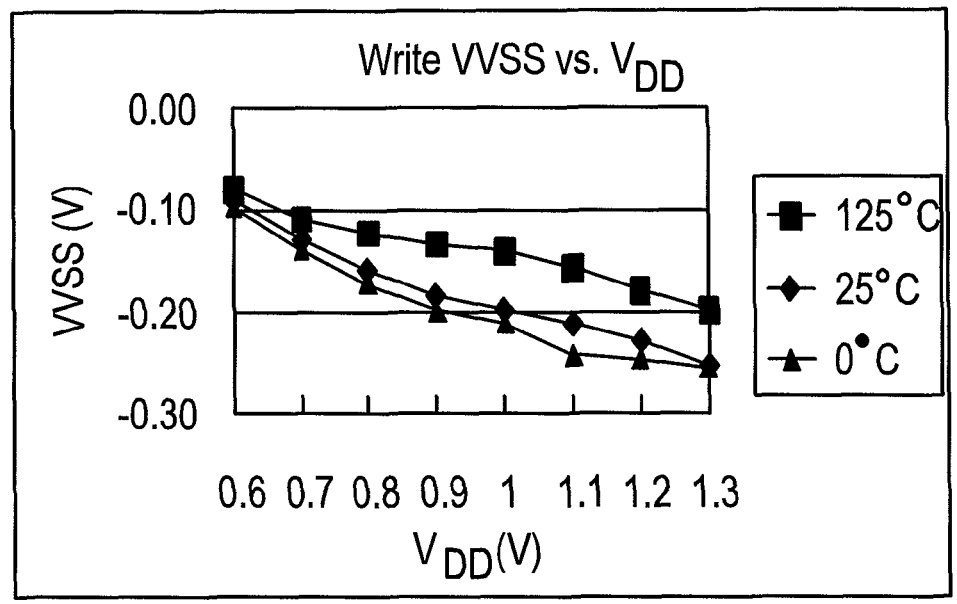
FIG. 12 is a schematic diagram of negative VVSS level vs. VDD according to the invention.
Figure 13:
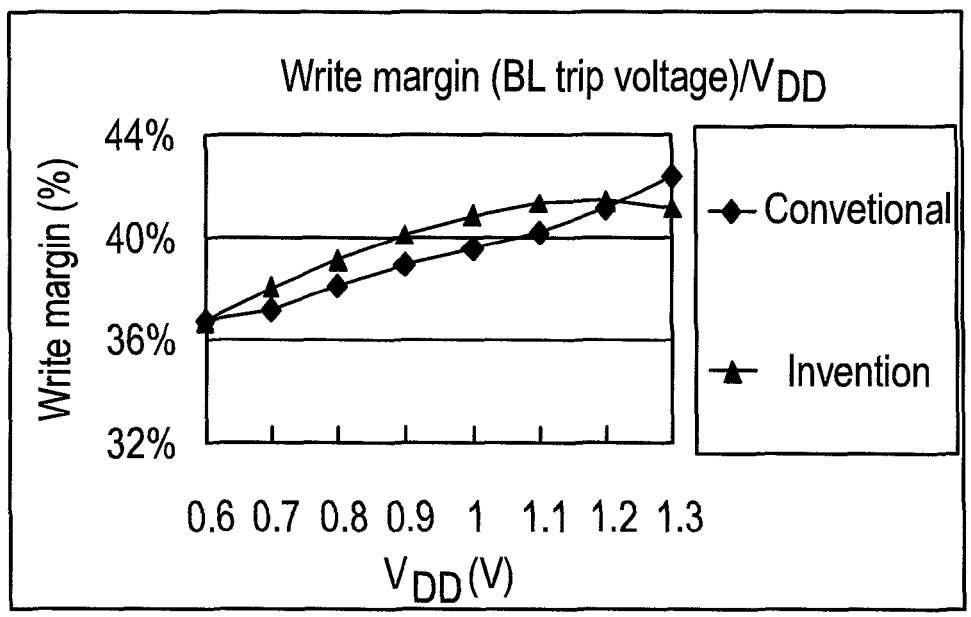
FIG. 13 is a schematic diagram of write margin comparison between conventional MP memory cell and MP memory cell with write enhancement control of the present invention.

FIG. 11 shows a schematic diagram of data-aware negative VVSS generator according to the invention. In a write cycle, when A/B-port input data DATA_A/DATA_B are "1," the PMOS capacitor 111 is boosted to a negative voltage level. Once WAY/WBY is activated, the negative voltage passes through 8-to-1 MUX to the selected VVSS line. FIG. 12 is a schematic diagram of negative VVSS level vs. VDD according to the invention. FIG. 13 is a schematic diagram of write margin comparison between conventional MP memory cell and MP memory cell with write enhancement control of the present invention. The definition of write margin is the ratio of the write bit-line (BL) voltage divided by VDD level when the cell's storage node flipped. As shown in FIG. 13, with write enhancement control, the write margin of the MP memory cell of the present invention has large write margin than that of the prior art.

Figure 14:
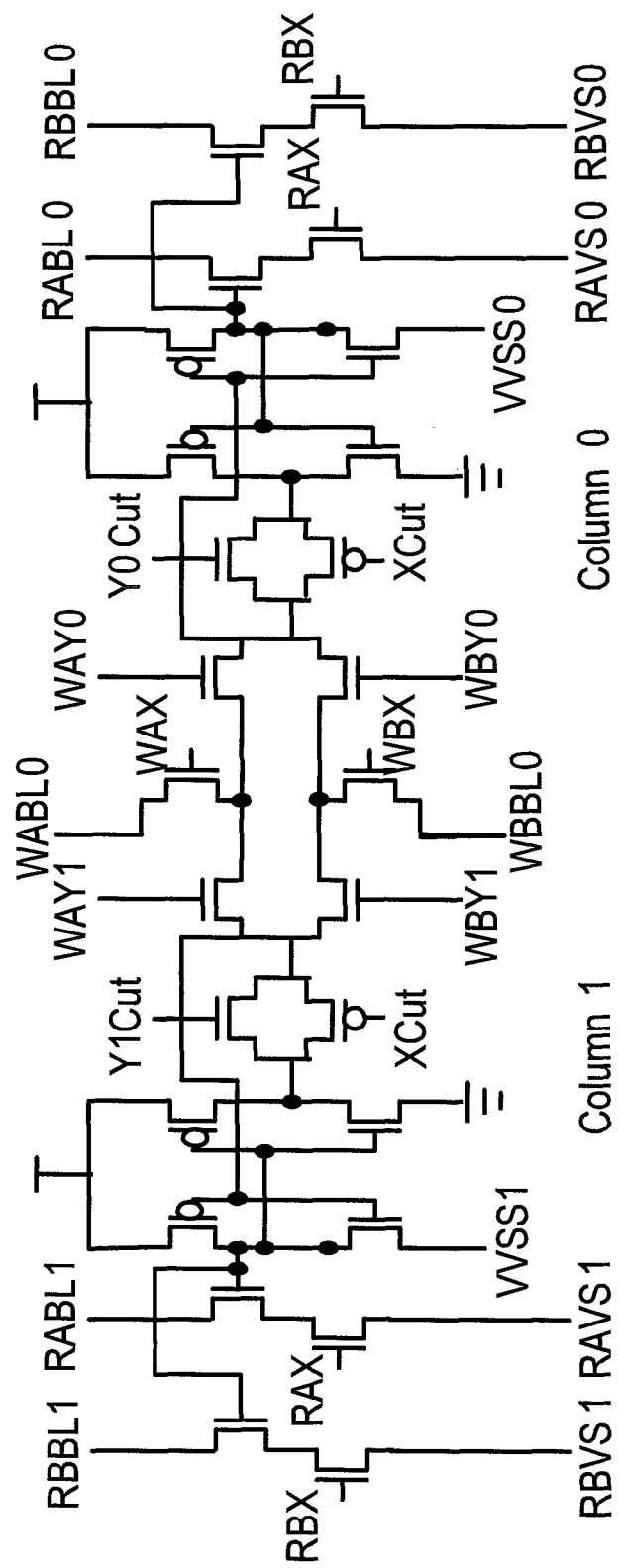
FIG. 14 is a circuit diagram of a multi-port SRAM with RAVS and RBVS replacing ground connection in the read-ports according to the invention.
Figure 15:
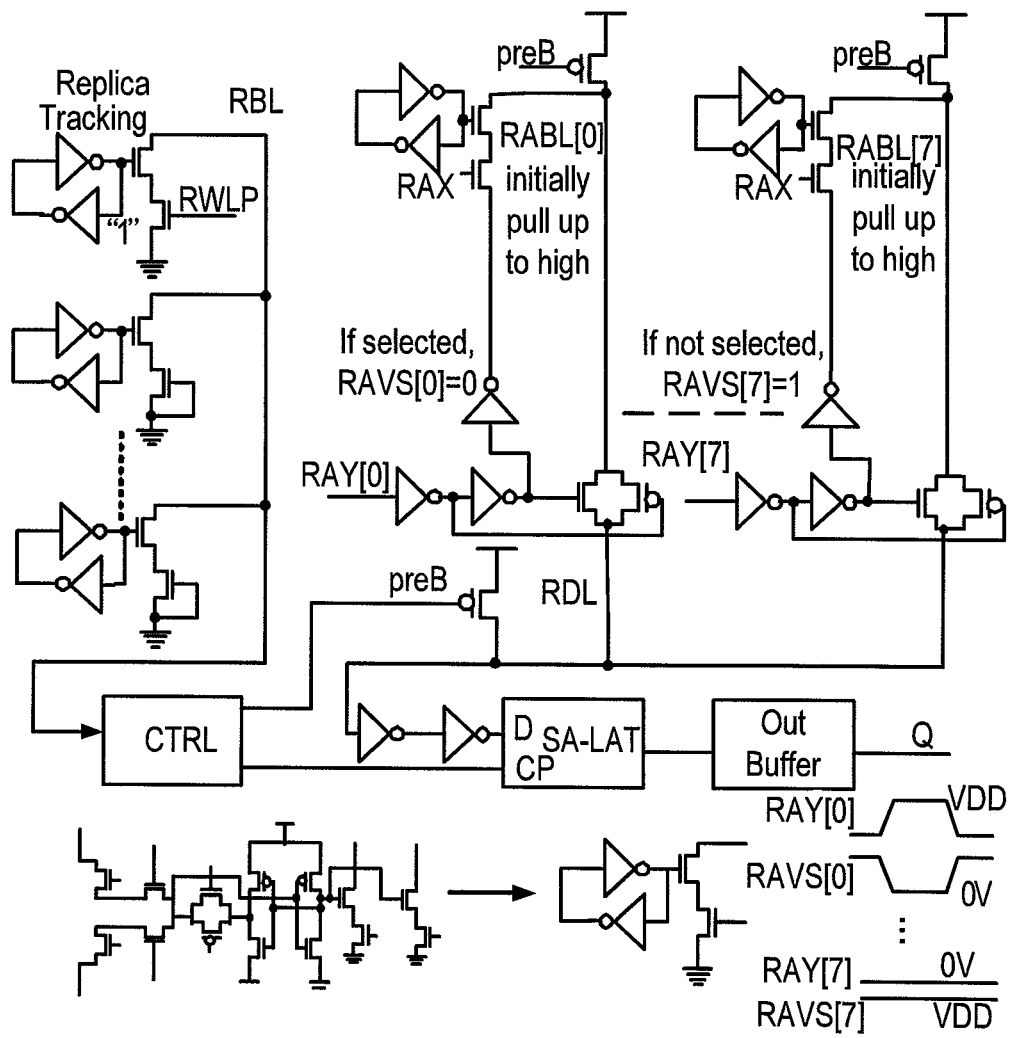
FIG. 15 is a schematic diagram of control circuit with RAVS and RBVS replacing ground connection in the read-ports according to the invention.

FIG. 14 is a circuit diagram of a multi-port SRAM with RAVS and RBVS replacing ground connection in the read-ports according to the invention. FIG. 15 is a schematic diagram of control circuit with RAVS and RBVS replacing ground connection in the read-ports according to the invention. Except for the write current reduction, the read current reduction replaces the read-port ground connection with RAVS and RBVS as shown in FIG. 14. As shown in FIG. 15, it shows a selective read path scheme for read current reduction. When the column-direction control signal RAY[0] is activated, it controls RAVS[0] to 0V. Conversely, RAY[7] is deactivated, RAVS[7] becomes the VDD level. The selective read path sets the selected read-port RAVS to 0V and sets the other unselected RAVS lines to the VDD level. Thus, only the selected bit-line (BL) can be discharged from VDD to ground when the storage node is "1" and the other bit-lines (BLs) cannot be discharged. Therefore, the unselected BLs can return the read-half-select current consumption of pre-charging back to VDD. Additionally, a replica column tracks the read-BL (RBL) to control the timing of pre-charging the RDL line and the latch output to Q. The proposed bit-interleaving design selects only one of eight RBLs, achieving a 30% reduction in read current per read port.

Figure 16:
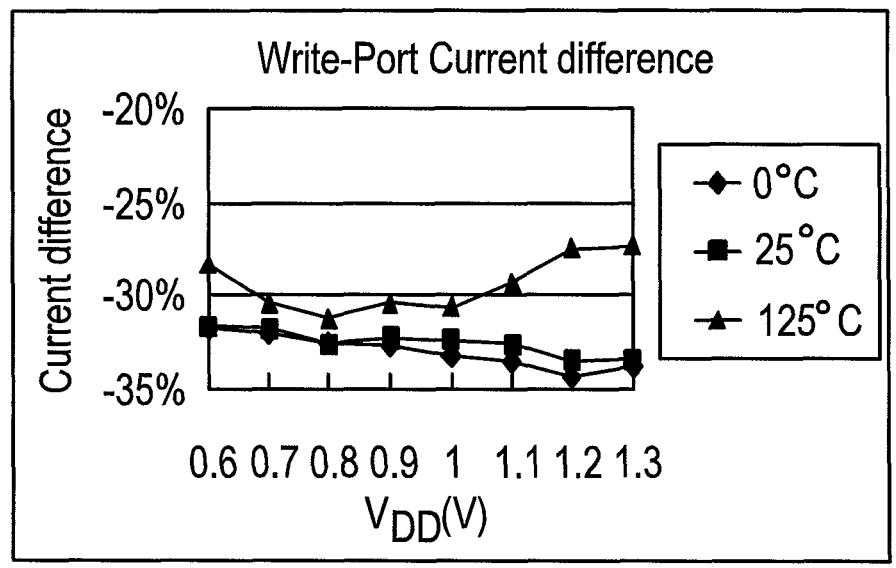
FIG. 16 shows a schematic diagram of write current reduction ratio of the invention vs. conventional MP SRAM.
Figure 17:
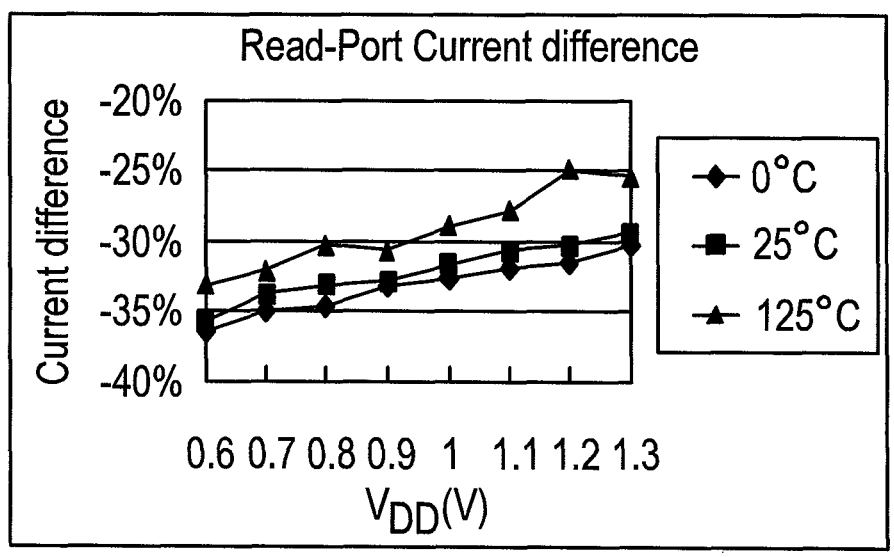
FIG. 17 shows a schematic diagram of read current reduction ratio of the selective read path vs. the conventional ground connection.

The technology of the present invention takes advantage of sharing a write bit-line across word-line access (WL-access) switches between adjacent columns, thereby reducing the number of write bit-lines. The effect of a reduced bit-line number on the current consumption was verified when the bit-lines were pre-charged back to VDD. FIG. 16 shows a schematic diagram of write current reduction ratio of the invention vs. conventional MP SRAM. Additionally, the selective read path scheme discharges only one RBL and the other seven RBLs remain in the pull-high state, reducing the read current. FIG. 17 shows a schematic diagram of read current reduction ratio of the selective read path vs. the conventional ground connection.

Figure 18:
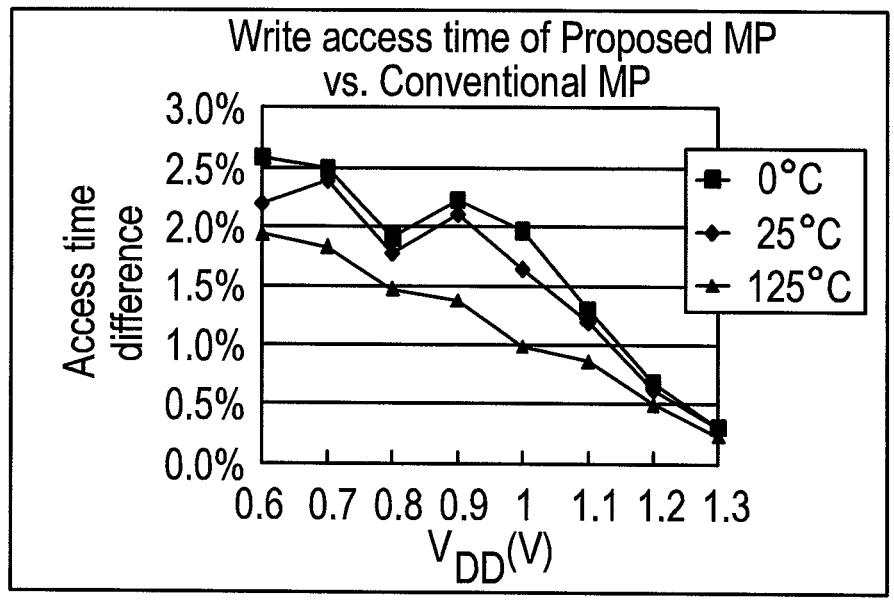
FIG. 18 shows a schematic diagram of write access time delay ratio.
Figure 19:
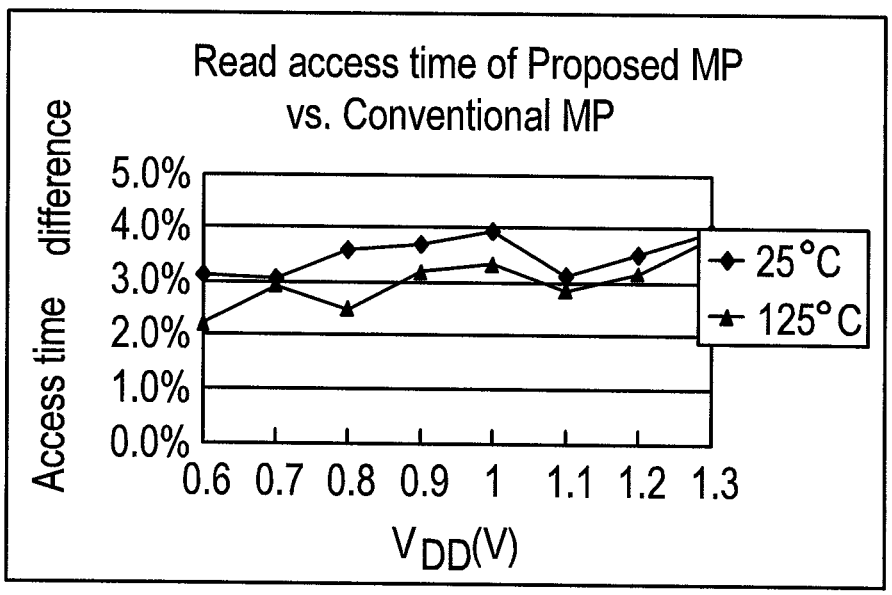
FIG. 19 shows a schematic diagram of read access time delay ratio.

The technology of the invention adds a Y-access MOS between the internal node and the write word-line access (WL-access) transistor, thus affecting the write-access time. The series resistance of the Y-access MOS and write WL-access transistor raises the access time delay from 0.5% to 3%. The selective read path employs a Y-direction signal to control the read-port connection determined by an inverter output instead of connecting to ground directly. Therefore, the read access time increases from 2% to 4%. FIG. 18 shows a schematic diagram of write access time delay ratio. FIG. 19 shows a schematic diagram of read access time delay ratio.

Figure 20:
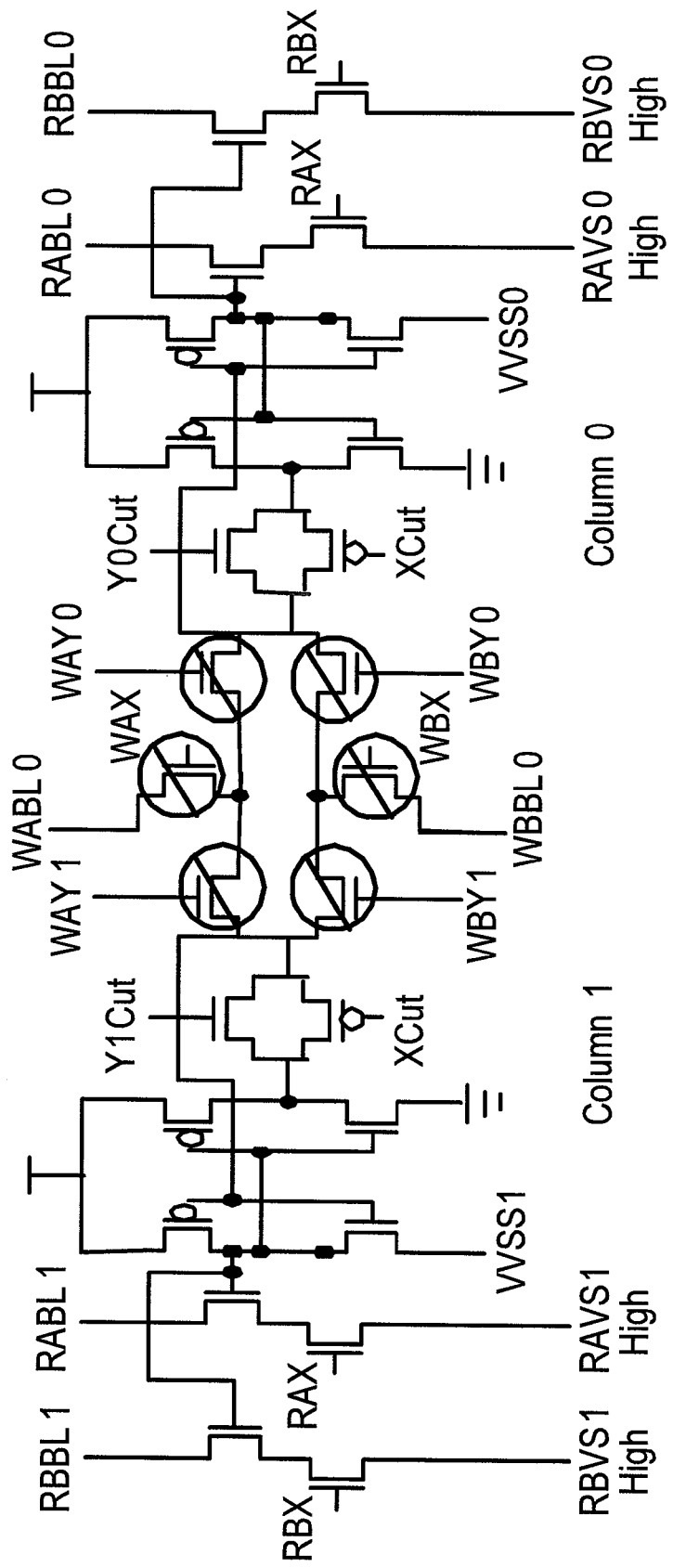
FIG. 20 shows a schematic diagram of the proposed MP-adjacent cells in the hold state.
Figure 21:
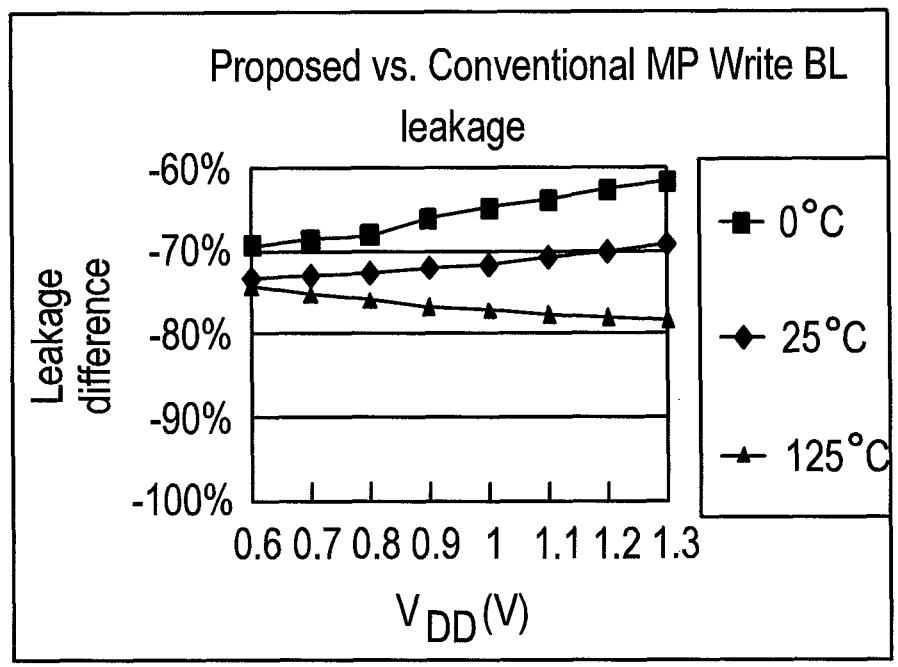
FIG. 21 shows a schematic diagram of a write BL leakage reduction ratio of approximately 60% to 90%.
Figure 22:
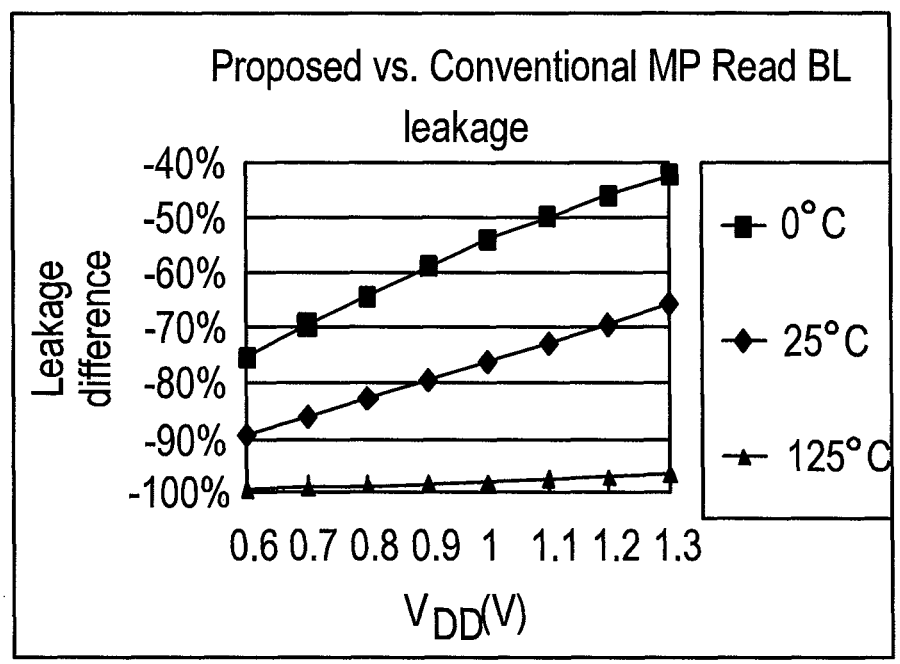
FIG. 22 shows a schematic diagram of the read BL leakage reduction ratio more than 40%.

FIG. 20 shows a schematic diagram of the proposed MP-adjacent cells in the hold state. The WAX, WBX, WAY0, WBY0, WAY1, and WBY1 are deactivated when the write bit-line (BL) is pre-charged to VDD. Because the write BL leakage current must pass through two disabled series-connecting MOS to the "0" storage node, this design reduces the sub-threshold leakage compared to that of the conventional MP cell array, which has only one write WL-control MOS on the leakage path. FIG. 21 shows a schematic diagram of a write BL leakage reduction ratio of approximately 60% to 90%. As shown in FIG. 20, it also shows the selective read path pulled high to read ports on RAVS/RBVS, reducing the read BL leakage current. FIG. 22 shows a schematic diagram of the read BL leakage reduction ratio more than 40%.

In view of the foregoing, it is known that the present invention provides a multi-port (MP) SRAM with shared write bit-line architecture and selective read path for low power operation, which can share adjacent bit-lines, cancel read/write disturb, and expand the static noise margin. Furthermore, the total number of bit-lines can be reduced to half thereby reducing the read/write power consumption on charging a bit-line. As compared with the conventional dual-port SRAM, the present invention can also reduce the bit-line leakage.

Although the present invention has been explained in relation to its preferred embodiment, it is to be understood that many other possible modifications and variations can be made without departing from the spirit and scope of the invention as hereinafter claimed.

What is claimed is:

1. A multi-port SRAM with shared write bit-line architecture and selective read path for low power operation, comprising:
a first memory cell having a first switch set connected to a first A-port read bit-line and a first B-port read bit-line, and a second switch set coupled to an A-port write bit-line and a B-port write bit-line;
a second memory cell having a third switch set connected to a second A-port read bit-line and a second B-port read bit-line, and a fourth switch set coupled to the A-port write bit-line and the B-port write bit-line; and
a common switch set is connected to the second switch set and the fourth switch set,
wherein the second memory cell makes use of the common switch set to share the A-port write bit-line and the B-port write bit-line with the first memory cell;
wherein the first switch set and the third switch set have same structure, and the second switch set and the fourth switch set have same structure.

2. The multi-port SRAM with shared write bit-line architecture and selective read path for low power operation as claimed in claim 1, wherein the first switch set has a first switch, a second switch, a third switch, and a fourth switch; the second switch set has a fifth switch, a sixth switch, a seventh switch, and an eighth switch; the third switch set has a ninth switch, a tenth switch, an eleventh switch and a twelfth switch; the fourth switch set has a thirteenth switch, a fourteenth switch, a fifteenth switch and a sixteenth switch.

3. The multi-port SRAM with shared write bit-line architecture and selective read path for low power operation as claimed in claim 2, wherein the common switch set has a seventeenth switch and an eighteenth switch; the seventeenth switch has one end connected to the A-port write bit-line, a control terminal connected to a row write A-port control line, and the other end connected to the fifth switch; the eighteenth switch has one end connected to the B-port write bit-line, a control terminal connected to a row write B-port control line, and the other end connected to the sixth switch.

4. The multi-port SRAM with shared write bit-line architecture and selective read path for low power operation as claimed in claim 3, wherein the first switch has one end connected to the first A-port read bit-line, and the other end connected to one end of the second switch; the second switch has the other end connected to the second low voltage and a control terminal connected to a row read A-port control line; the third switch has one end connected to the first B-port read bit-line, and the other end connected to one end of the fourth switch; the fourth switch has the other end connected to the second low voltage and a control terminal connected to a row read B-port control line.

5. The multi-port SRAM with shared write bit-line architecture and selective read path for low power operation as claimed in claim 4, wherein the fifth switch has one end connected to the common switch set, and a control terminal connected to a first-column write A-port control line; the sixth switch has one end connected to the common switch set, and a control terminal connected to a first-column write B-port control line; the seventh switch has a control terminal connected to a first-column cut control line; the eighth switch has a control terminal connected to a row cut control line.

6. The multi-port SRAM with shared write bit-line architecture and selective read path for low power operation as claimed in claim 5, wherein the ninth switch has one end connected to the second A-port read bit-line and the other end connected to one end of the tenth switch; the tenth switch has the other end connected to the second low voltage and a control terminal connected to the row read A-port control line; the eleventh switch has one end connected to the second B-port read bit-line, a control terminal connected to the control terminal of the ninth switch, and the other end connected to one end of the twelfth switch; the twelfth switch has the other end connected to the second low voltage and a control terminal connected to the row read B-port control line.

7. The multi-port SRAM with shared write bit-line architecture and selective read path for low power operation as claimed in claim 6, wherein the thirteenth switch has one end connected to the common switch set, and a control terminal connected to a second-column write A-port control line; the fourteenth switch has one end connected to the common switch set, and a control terminal connected to a second-column write B-port control line; the fifteenth switch has a control terminal connected to a second-column cut control line; the sixteenth switch has a control terminal connected to the row cut control line.

8. The multi-port SRAM with shared write bit-line architecture and selective read path for low power operation as claimed in claim 7, wherein the first to seventh switches, the ninth to fifteenth switches, the seventeenth, and the eighteenth switches are each an NMOS transistor, and the eighth and sixteenth switches are each a PMOS transistor.

9. The multi-port SRAM with shared write bit-line architecture and selective read path for low power operation as claimed in claim 3, wherein first low voltage is lower than the second low voltage.

* * * * *